United States Patent [19]

Sasaki

[11] 4,407,059
[45] Oct. 4, 1983

[54] METHOD OF PRODUCING SEMICONDUCTOR DEVICE

[75] Inventor: Yoshitaka Sasaki, Yokohama, Japan
[73] Assignee: Tokyo Shibaura Denki Kabushiki Kaisha, Japan
[21] Appl. No.: 294,749
[22] Filed: Aug. 20, 1981

[30] Foreign Application Priority Data

Aug. 25, 1980 [JP] Japan .................... 55-116562

[51] Int. Cl.³ .................................... H01L 21/225
[52] U.S. Cl. ........................... 29/571; 29/569 R; 29/578; 29/591; 148/187; 148/188
[58] Field of Search .............. 29/569 R, 578, 571, 29/591; 148/187, 188, 175

[56] References Cited

U.S. PATENT DOCUMENTS

| | | | |
|---|---|---|---|
| 4,190,466 | 2/1980 | Bhattacharyya et al. | 148/187 X |
| 4,270,262 | 6/1981 | Hori et al. | 29/571 |
| 4,292,728 | 10/1981 | Endo | 29/571 |
| 4,317,276 | 3/1982 | Heeren et al. | 148/187 X |
| 4,322,882 | 4/1982 | Vora | 148/187 X |
| 4,322,883 | 4/1982 | Abbas et al. | 148/188 X |
| 4,338,139 | 7/1982 | Shinada | 148/187 |

OTHER PUBLICATIONS

D. D. Tang et al., IEDM Tech. Papers, pp. 201–204, (1979), "Sub—Nanosecond Self—Aligned I²L/MTL Circuits."

Primary Examiner—G. Ozaki
Attorney, Agent, or Firm—Finnegan, Henderson, Farabow, Garrett & Dunner

[57] ABSTRACT

Disclosed is a method of producing a semiconductor device, comprising forming an oxidation-resistive insulating film having one or more openings on a semiconductor substrate, forming an impurity-doped polysilicon pattern in at least the opening of the insulating film by using a mask substantially equal in size to the opening, forming a silicon oxide film on the exposed surface of the polysilicon pattern by thermal oxidation, removing the insulating film, and depositing a conductive material and, then, patterning said conductive material layer for forming an interconnection electrode layer insulated from the polysilicon pattern by the silicon oxide film.

13 Claims, 36 Drawing Figures

METHOD OF PRODUCING SEMICONDUCTOR DEVICE

BACKGROUND OF THE INVENTION

The present invention relates to a method of producing a semiconductor device.

A bipolar transistor suitable for use within the high frequency range or suitable as a high speed switching element is required to have a great gain band product. In order to increase the gain band product of the bipolar transistor, it is necessary to make the element size smaller and especially to reduce the base transit time of the minority carriers. Most of the silicon transistors which are currently used are of the planar type, and their emitters and bases are formed by impurity diffusion. In such a case, when the dimension of the emitter is small, the junction plane of the emitter and the base becomes curved, and the effective base transit time depends not only on the base width but also on the collector-base junction depth. Accordingly, for improving the gain band product of the bipolar transistor, it is necessary to reduce the base width as well as the collector-base junction depth. Thus, the problem is to how to realize a shallow diffusion junction.

Figure 1:
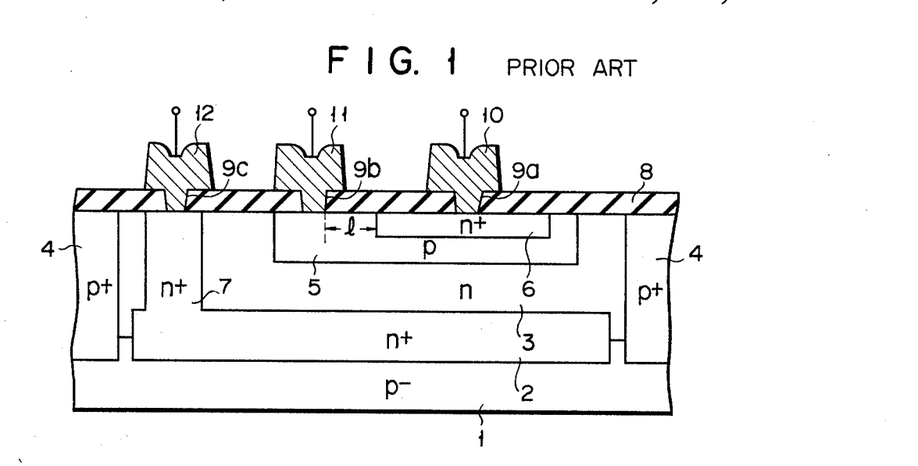
FIG. 1 is a cross sectional view of a conventional npn-type bipolar transistor.

A conventional bipolar npn transistor is of the structure shown in FIG. 1. On a p$^-$-type silicon substrate 1 are formed an n$^+$-type buried layer 2 and an n-type epitaxial layer 3. A p$^+$-type isolation region 4 for element isolation is formed in the epitaxial layer 3. A p-type base region 5 is formed at the part of the island epitaxial layer 3 isolated by the isolation region 4, and an n$^+$-type emitter region 6 is formed in the base region 5. A diffusion layer 7 reaching to the n$^+$-type buried layer 2 for connection with the collector is formed in another part of the epitaxial layer 3. An oxide film 8 is formed on the n-type epitaxial layer 3 by thermal oxidation. Aluminum electrodes 10, 11 and 12 for connection with the emitter region 6, the base region 5, and the diffusion layer 7 for connection with the collector are formed thereover through contact holes 9a, 9b and 9c, respectively.

In a bipolar transistor of such a structure, when the depth of the base region 5 is made small, the base resistance increases accordingly. Especially when the base region 5 becomes extremely shallow, the base resistance depends on the distance l between the emitter side end of the base contact hole 9b and the emitter region 6. This distance l is determined by the relative positions of the diffusion windows for the emitter region 6 and the base contact holes. This relation is in turn determined by the photoetching technique. With the current photoetching technique, it is difficult to make the distance l less than 1.5 μm. This places a limit on the reduction of the base resistance.

Figure 2:
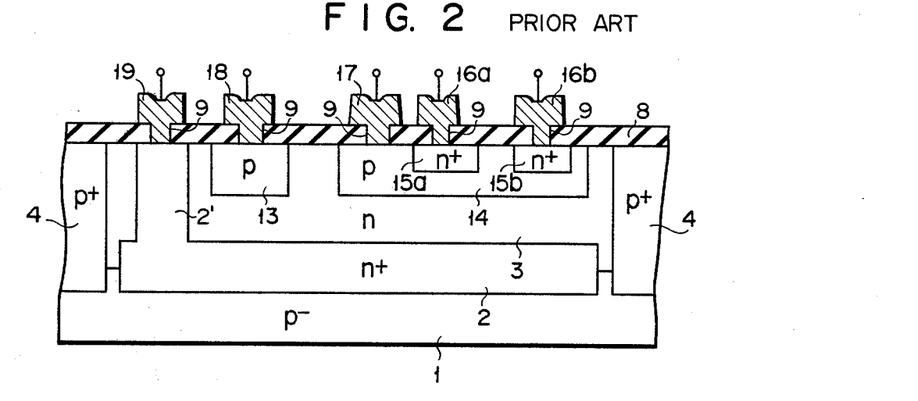
FIG. 2 is a cross sectional view of a conventional I²L.

Taking an I$^2$L (Integrated Injection Logic) element which is a bipolar logic element as an example, a conventional I$_2$L is of the structure shown in FIG. 2. In the p$^-$-type silicon substrate 1 are formed the n$^+$-type buried layer 2 and the n-type epitaxial layer 3. The epitaxial layer 3 is isolated by the p$^+$-type isolation region 4. A p-type injector 13 and a p-type base region 14 are formed in the epitaxial layer 3. A plurality of n$^+$-type collector regions 15a, 15b are formed in the base region 14. The oxide film 8 is formed on the epitaxial layer 3 by thermal oxidation. On the oxide film 8 are formed through the contact holes 9 the collector regions 15a, 15b, the base region 14, rhw injector 13, and aluminum electrodes 16a, 16b, 17, 18 and 19 connected with an extension 2' of the n$^+$-type buried layer 2.

An I$^2$L of such a structure is a bipolar logic element of a composite structure incorporating a vertical npn transistor of the reverse operation type wherein the emitter and the collector of a normal transistor are reversed, and a lateral pnp transistor using the base of the vertical npn transistor as the collector. With such an I$^2$L, since the vertical npn transistor as the inverter is inverted, the emitter-base junction area is vastly greater than the collector-base junction area so that a sufficiently high speed operation of the bipolar element may not be attained. Thus, since carrier injection into the base region is performed from the entire emitter region surrounding the part immediately below the collector region, the effective base width becomes great, the current amplification factor becomes small, and the gain band product becomes small. As a result, the performance of the I$^2$L is degraded, and especially the switching speed is suppressed.

An I$^2$L which is free of such defects is described in IEDM Technical Digest (1979), pp. 201 to 204, "Sub-Nanosecond Self-Aligned I$^2$L/MTL Circuits". A polycrystalline silicon layer in which is doped an n$^+$-type impurity to a high concentration is used as the collector region in this I$^2$L. The base contact holes and the collector region are formed by the self-aligning technique utilizing the thickness difference with the silicon oxide film. The base region exposed at the surface of the substrate is covered with a metal to decrease the base resistance, allowing a structure such that the ratio of the emitter-base junction area to the collector-base junction area may approach 1. This I$^2$L shows the best performance of 0.8 nsec in minimum propagation delay time among the conventional I$^2$Ls. However, this I$^2$L also has many problems. The method for fabricating this element will be described in detail with reference to the attached drawings.

Figure 3A:
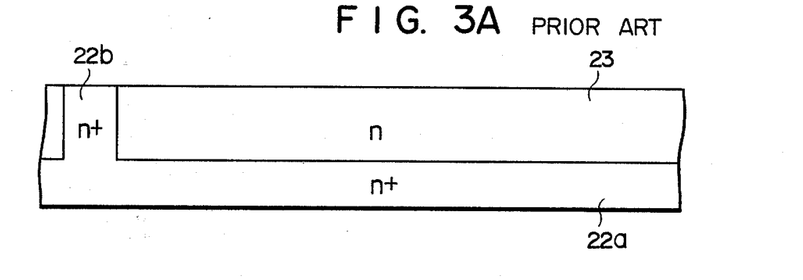
FIGS. 3A to 3F are cross sectional views showing a conventional method of producing an improved I²L.

First, an n-type epitaxial layer 23 is formed in an n$^+$-type semiconductor substrate 22a. A high-concentration n$^+$-type semiconductor film 22b is formed at the surface of the substrate 22a to provide the emitter region (FIG. 3A).

Figure 3B:
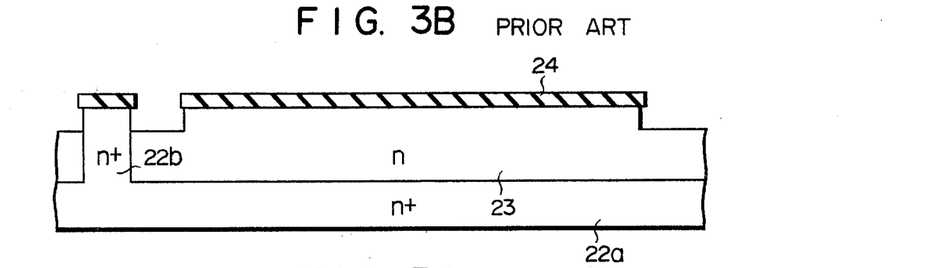
Figure 3C:
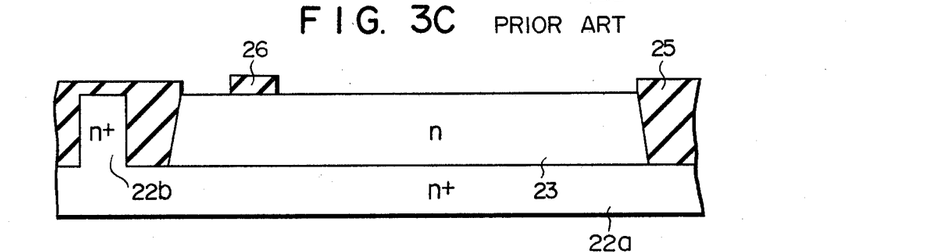

Next, a silicon nitride layer 24 is deposited to a thickness of 1,000 Å, as shown in FIG. 3B. After removing desired parts of the silicon nitride layer, the n-type epitaxial layer 23 thereunder is selectively etched. A heat treatment is performed to form a silicon oxide layer 25 of about 1.0 to 1.5 μm thickness on the etched part. Since this silicon oxide layer 25 is formed to surround the periphery of the I$^2$L gate, it is also called the oxide film collar or the oxide isolation layer. This silicon oxide layer functions to isolate the gates of the I$^2$L from one another and to improve the injection efficiency of the minority carriers injected from the emitter to the base. After removing all of the silicon nitride layer 24, a silicon oxide layer is again formed to a thickness of 5,000 Å. By opening a desired part of the silicon oxide layer, a silicon oxide layer 26 is formed (FIG. 3C).

Figure 3D:
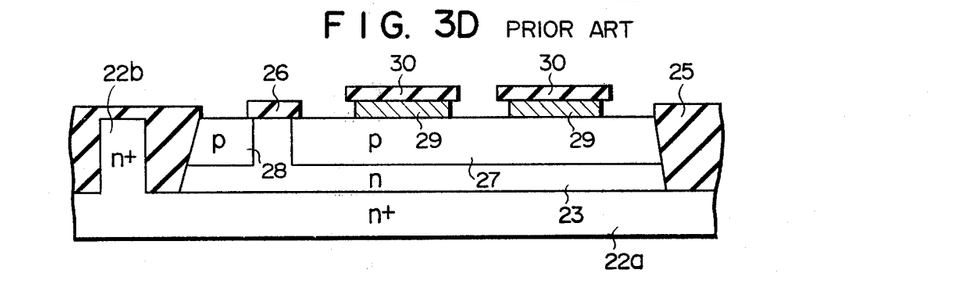

After forming a base region 27 and an injector region 28, an arsenic-doped polycrystalline silicon film 29 is deposited to a thickness of 3,000 Å, and a CVD silicon oxide layer (CVD-SiO$_2$) 30 is deposited thereover to a thickness of 3,000 A. The CVD-SiO$_2$ is patterned by the photoetching technique. Using the CVD-SiO$_2$ pattern 30 as a mask, the arsenic-doped polycrystalline silicon film is etched with a solution of a mixture of HF:HNO$_3$:CH$_3$COOH=1:3:8 (FIG. 3D). The selectively left portion of the arsenic-doped polycrystalline silicon film 29 exists on the base region 27 for forming the collector region of the I$^2$L, and is used for connection with the collector electrode.

Figure 3E:
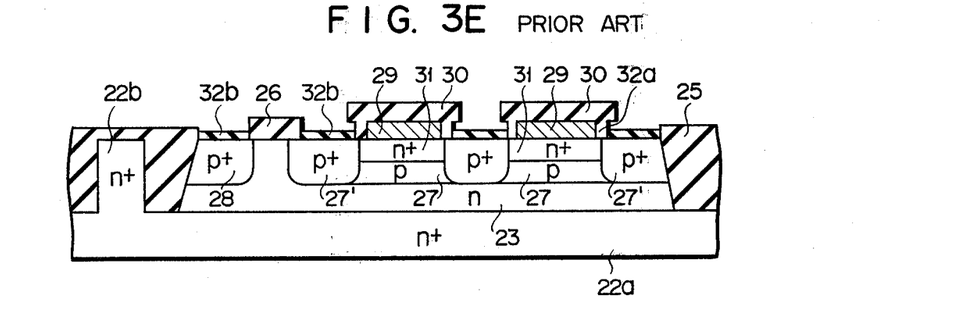

After forming a collector region 31 by diffusion using the arsenic-doped polycrystalline silicon film 29 as a diffusion source, the structure is thermally oxidized at a low temperature (700° to 900° C.). At this time, a silicon oxide film 32b of about several hundred Å thickness is formed on the base region 27 and the injector region 28, and a silicon oxide film 32a of about 1,000 to 2,000 Å thickness is formed on the side surface of the arsenic-doped polycrystalline silicon film 29. This is because the growing speed of the high-concentration n+-type semiconductor layer is greater by a factor of several to several tens that of the low-concentration n+-type semiconductor layer when oxidized at a low temperature (700° to 900° C.). Next, for reducing the contact resistance with metal electrode layer, ion implantation of high-concentration p+-type ions is performed to form the injector region 28 and an outer base region 27' by diffusion (FIG. 3E).

Figure 3F:
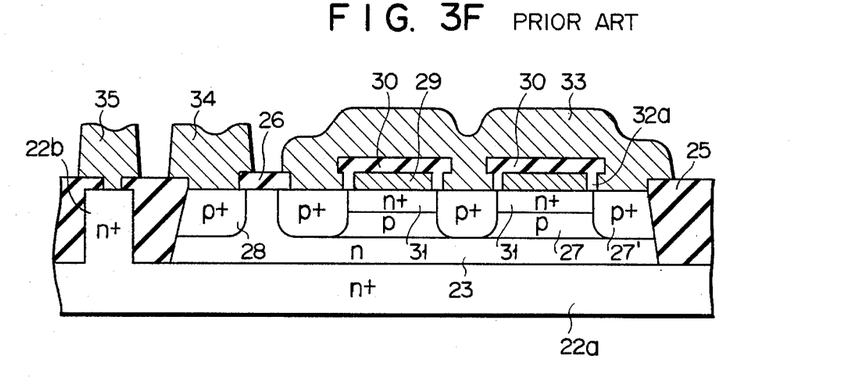
Figure 4:
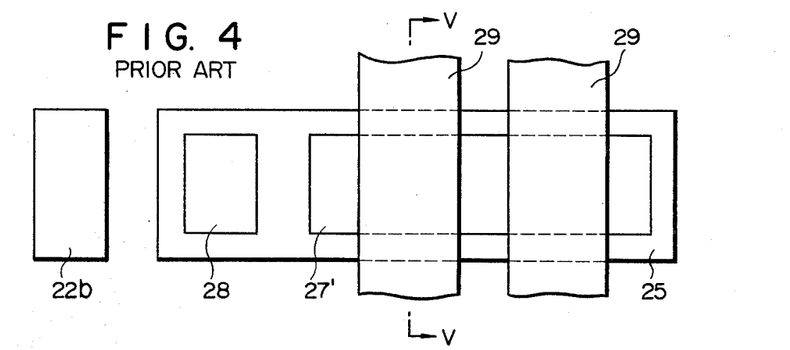
FIG. 4 is a plan view of FIG. 3F.
Figure 5:
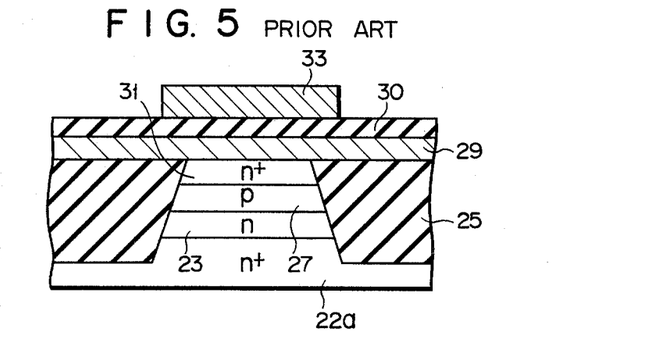
FIG. 5 is a cross sectional view along the line V—V of FIG. 4.

Then, the silicon oxide film 32b on the injector region 28 and the outer base region 27' is etched by the self-aligning technique. All the contact holes are opened by the photoetching technique. After coating a metal electrode layer, electrode isolation is performed to form a base-connecting electrode 33, an injector-connecting electrode 34, and an emitter-grounding electrode 35 to provide an I$^2$L (FIG. 3F). FIG. 4 shows a plan view of FIG. 3F, and FIG. 5 shows a sectional view along the line V—V of FIG. 4.

With an I$^2$L fabricated by the above process, the electrodes of the base, the injector, and the emitter may be formed from the metal electrode layer, and the collector electrode may be formed from the arsenic-doped polycrystalline silicon layer, providing the various advantages described above. However, this method of fabricating an I$^2$L has various problems to be described below.

In the process shown in FIG. 3D, when etching the arsenic-doped polycrystalline silicon film using the CVD-SiO$_2$ film pattern 30 as a mask, isotropic etching using a mixture of HF, HNO$_3$, and CH$_3$COOH as a liquid etchant is used. Accordingly, the polycrystalline film is side etched to a depth corresponding to its film thickness, so that the CVD-SiO$_2$ film 30 overhangs. When the arsenic-doped polycrystalline silicon film 29 is oxidized under such conditions, the silicon oxide film 32a grows in an anomalous form at the circumferential surface of the arsenic-doped polycrystalline silicon film 29, moving the underlying CVD-SiO$_2$ pattern 30 upward. This disadvantageously tends to cause a disconnection of the base-connecting electrode crossing the arsenic-doped polycrystalline silicon film 29. Furthermore, since this arsenic-doped polycrystalline silicon film 29 is used as an interconnection layer for connections between the elements, this also tends to cause a disconnection from the second interconnection layer crossing thereover at the parts of the oxide film other than the element regions.

Secondly, it is impossible to make the arsenic-doped polycrystalline silicon film thicker than 3,000 Å for preventing this overhanging. It follows from this that it is impossible to reduce the resistance of the arsenic-doped polycrystalline silicon film as the wiring for connection with the collector electrode. Furthermore, since the arsenic-doped polycrystalline silicon film 29 is thermally oxidized at a low temperature (700° to 900° C.) in the process shown in FIG. 3E, the wiring width becomes smaller and the wiring resistance becomes greater accordingly.

Figure 6A:
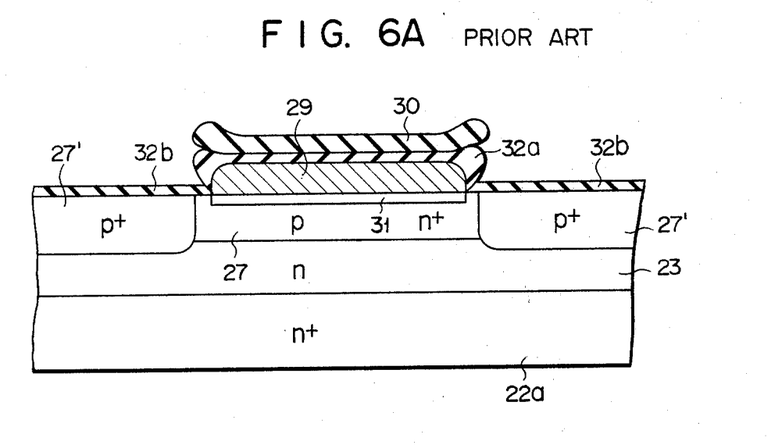
FIG. 6A is a cross sectional view showing the condition of the I²L after thermal oxidation in the step shown in FIG. 3E.
Figure 6B:
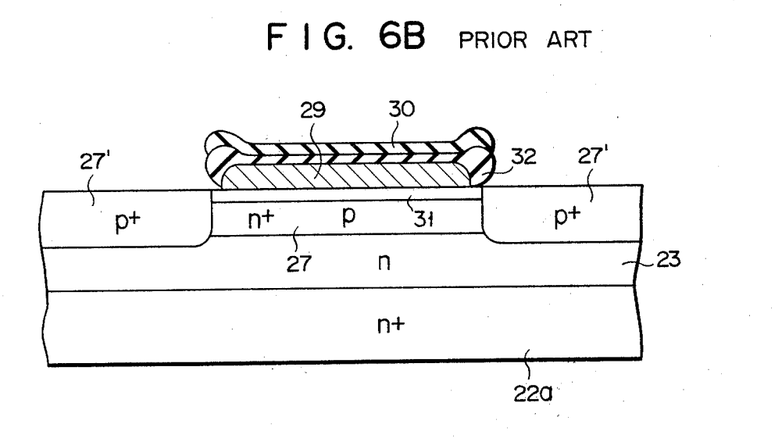
FIG. 6B is a cross sectional view showing the condition after the etching in the step shown in FIG. 3E.

Thirdly, as shown in FIG. 3E, as a method for forming the base contact holes and the collector region by the self-aligning technique, different growing speeds of the silicon oxide film by low temperature oxidation of semiconductor layers due to different kinds of impurities or different impurity concentrations are utilized. The silicon oxide film 32a obtained by low temperature oxidation of the n+-type semiconductor layer of high concentration is formed to be several times thicker than the silicon oxide film 32b formed on the p−-type semiconductor layer of low impurity concentration as the temperature for oxidation becomes lower. However, such a thick silicon oxide film is inferior in denseness, resulting in inferior insulating characteristics. Especially, when the silicon oxide film obtained by oxidizing at 800° C. the n+-type polycrystalline silicon layer of high impurity concentration is etched in an HF-type solution, the insulating characteristics are very inferior. Although a silicon oxide film of 1,000 Å thickness formed by oxidation of a single-crystalline silicon layer at a high temperature (above 1,000° C.) has a breakdown voltage of 80 to 90 V, the silicon oxide film of 2,000 Å thickness described above has a breakdown voltage of 10 to 20 V or less, occasionally becoming zero. When observations are made after thermal oxidation, the silicon oxide film 32a, grown on both sides of the arsenic-doped polycrystaline silicon film 29 over the base region 27 formed in the single-crystalline silicon layer, grows less at the contact part with the single-crystalline silicon layer (base region 27) and is recessed as in FIG. 6A. Due to this, when the silicon oxide film 32b at both sides of the arsenic-doped polycrystalline silicon film is etched by an HF-type etchant, the silicon oxide film 32a of the arsenic-doped polycrystalline silicon film 29 is inferior in denseness and weakly resistant to the etchant. Furthermore, since the contact part with the base region 27 is thinner as compared with other parts, the lower side surface of the arsenic-doped polycrystalline silicon film 29 of the collector region 31 is etched as shown in FIG. 6B, exposing the n+-type collector region 31 formed by using the polycrystalline silicon film 29 as a diffusion source from the side surface of the polycrystalline silicon film 29. As a result, when the base connecting electrode 33 is formed, the electrode 33 contacts the exposed part of the collector region 31, thereby short-circuiting the base and the collector.

SUMMARY OF THE INVENTION

It is an object of the present invention to provide a method of producing a semiconductor device according to which the problems described above are solved and high performance and high integration are possible.

According to the present invention, there is provided a method of producing a semiconductor device, comprising the steps of:

forming an oxidation-resistive insulating film having one or more openings on a semiconductor substrate;

forming an impurity-doped polycrystalline silicon (polysilicon) pattern in at least the opening of the insulating film by using a mask substantially equal in size to the opening;

forming a silicon oxide film on the exposed surface of the polysilicon pattern by thermal oxidation;

removing the insulating film; and depositing a conductive material and, then, patterning said conductive material layer for forming an interconnection electrode layer insulated from the polysilicon pattern by the silicon oxide film.

DETAILED DESCRIPTION OF THE PREFERRED EMBODIMENT

The method of the present invention comprises the step of forming an oxidation-resistive insulating film. The insulating film serves to prevent an oxidizing agent from entering the region beneath the insulating film in the subsequent step of thermal oxidation. As a result, a thermal oxide film is not formed beneath the insulating film mentioned. It should also be noted that the oxidation-resistive insulating film exhibits a high selective etching property relative to a thermal oxide film. Thus, the insulating film in question can be easily removed by etching without reducing the thickness of a thermal oxide film formed on the polysilicon pattern surface in the thermal oxidation step. In the present invention, a silicon nitride film, an alumina film, etc. can be used as the oxidation-resistive insulating film.

The present invention also comprises the step of forming an impurity-doped polysilicon pattern. In forming the polysilicon pattern, an undoped polysilicon is deposited on the entire surface by CVD, followed by introducing an impurity into the deposited polysilicon layer. Then, the doped polysilicon layer is patterned by photolithography, using a mask substantially equal in size to the opening of the oxidation-resistive insulating film formed in advance. Alternatively, an impurity-doped polysilicon is directly deposited on the entire surface, followed by patterning the deposited polysilicon layer by photolithography as mentioned above. Incidentally, the polysilicon pattern is not necessarily formed accurately within the opening of the oxidation-resistive insulating film; a slight deviation is acceptable. Suppose one end of the polysilicon pattern partially overlaps with the insulating film so as to provide a clearance between the other end of the polysilicon pattern and the edge of the opening made in the insulating film. In this case, the silicon oxide film formed on the polysilicon pattern surface in the subsequent thermal oxidation step serves to ensure a sufficient insulation between the interconnection electrode formed on the silicon oxide film and the polysilicon pattern.

The impurity-doped polysilicon pattern can be used as an electrode connected to the semiconductor region of a bipolar transistor, static induction transistor (SIT), etc., as a gate electrode of a MOS transistor and a jumper wiring layer. When used as an electrode connected to a semiconductor region, the doped polysilicon pattern provides a diffusion source for forming the semiconductor region in the substrate. The impurity diffusion may be performed in the thermal oxidation step or separately from the thermal oxidation step. The semiconductor region thus formed acts as the emitter region of a bipolar transistor or as the collector region of an I²L.

The polysilicon pattern should be doped with an impurity equal in conductivity type to the semiconductor substrate when it comes to a bipolar transistor, I²L, SIT, etc. But, the conductivity type of the impurity may be either equal or opposite to that of the substrate in the case of a MOS transistor.

For producing a bipolar transistor or an I²L by the method of the present invention, an impurity opposite in conductivity type to the semiconductor substrate is introduced into the surface region of the substrate before the step of forming an oxidation-resistive insulating film so as to form a base region (or an inner base region in the case of a double base type bipolar transistor or I²L). Further, for producing a double base type bipolar transistor, I²L, SIT, MOS transistor, etc., an impurity opposite in conductivity type to the semiconductor substrate is diffused into the surface region of the substrate after thermal oxidation of the polysilicon pattern with the oxide film used as a mask. The impurity diffusion may be performed before or after removal of the oxidation-resistive insulating film. The semiconductor region formed by the impurity diffusion acts as an outer base region in the case of a double base type bipolar transistor and I²L, and as source and drain regions in the case of a MOS transistor.

The conductive material used in the present invention includes, for example, Al; an Al alloy such as Al-Si, Al-Cu, or Al-Si-Cu; a refractory metal such as Mo, W, Pt, or Ta; and a metal silicide such as molybdenum silicide or tungsten silicide.

EXAMPLE 1

FIGS. 7A to 7H collectively show how to produce an I²L by the method of the present invention.

Figure 7A:
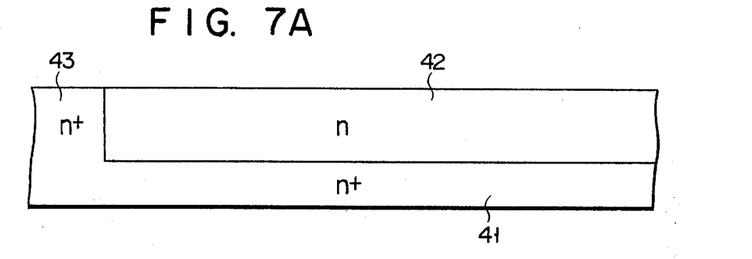
FIGS. 7A to 7H are cross sectional views showing how to produce an I²L by the method according to one embodiment of the present invention.
Figure 7B:
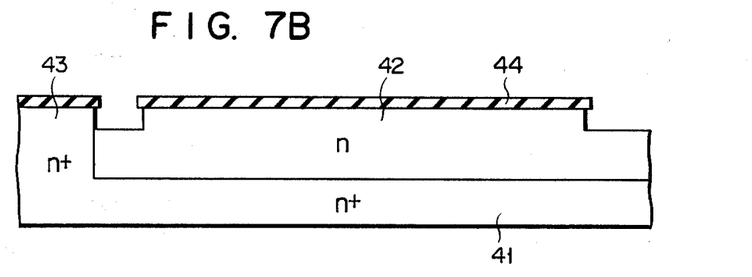
Figure 7C:
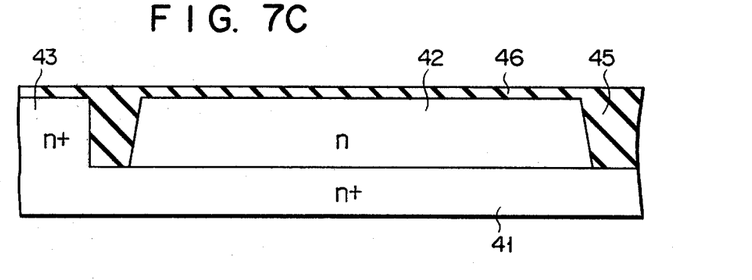
Figure 7D:
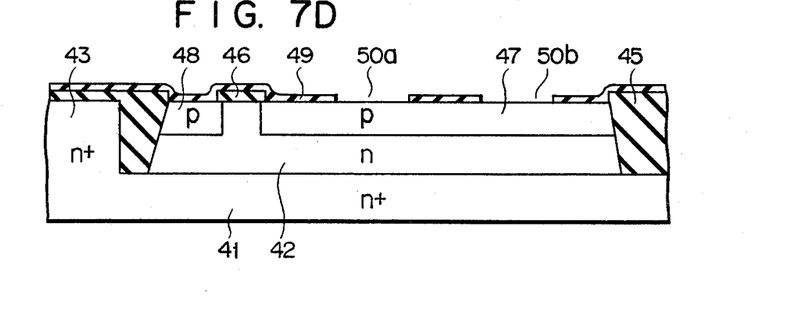

In the first step, a high concentration of phosphorus is selectively diffused into an n-type silicon epitaxial layer 42 formed on an n⁺-type silicon substrate 41 so as to form an n⁺-type region 43 acting as an emitter region as shown in FIG. 7A. Then, a silicon nitride film 44 having a thickness of 1,000 Å is formed on the entire surface, followed by selectively removing the silicon nitride film 44. The remaining silicon nitride film 44 is used as a mask for selectively etching in a depth of about 0.5 to 0.7μ the exposed region of the epitaxial layer 42 as shown in FIG. 7B. The remaining silicon nitride layer 44 is also used as a mask in the subsequent step of thermal oxidation treatment under a hot wet oxygen atmosphere for forming a silicon oxide film 45 having a thickness of about 1.0 to 1.5μ in the etched region of the epitaxial layer 42 (see FIG. 7C). The silicon oxide film 45, which is formed in a manner to surround an I²L gate, is also called an oxide film collar or an oxide film separation region and serves to separate adjacent I²L gates and to enhance the effect of minority carrier injection from the emitter region to the base region. After formation of the oxide film 45, the remaining silicon nitride film 44 is removed, followed by forming a thermal oxide film 46 having a thickness of 4,000 Å on the entire surface.

Then, the thermal oxide film 46 is selectively removed by photoetching method, followed by thermally diffusing boron into the epitaxial layer 42 through the openings made in the thermal oxide film so as to form a p-type base region 47 and a p-type injector region 48. Further, a silicon nitride film 49, i.e., oxidation-resistive insulating film, is deposited 1,000 Å thick by CVD on the entire surface, followed by selectively removing the silicon nitride film 49 by photoetching method so as to provide openings 50a and 50b (see FIG. 7D).

Figure 7E:
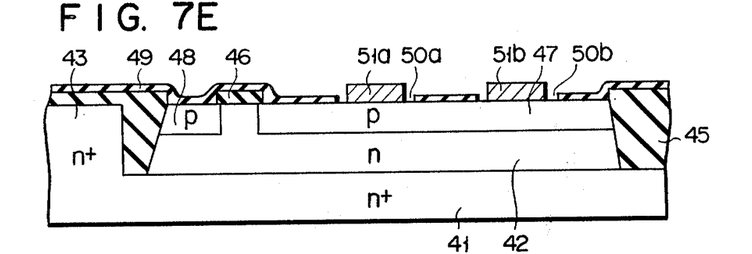

In the next step, a polysilicon layer about 2,000 to 3,000 Å thick, which is doped with arsenic, i.e., n-type impurity, is deposited on the entire surface, followed by selectively removing the doped polysilicon layer by photoetching method so as to form a polysilicon pattern 51a, 51b extending in a direction perpendicular to the longitudinal direction of the base region 47 as shown in FIG. 7E. It is seen that the polysilicon pattern 51a, 51b is located in the openings 50a, 50b. If there is no masking error in the photoetching step, a clearance corresponding to the thickness of the polysilicon layer is formed by the side etching of the polysilicon layer between the periphery of the polysilicon pattern 51a, 51b and the side wall of the silicon nitride film 49 defining the openings 50a, 50b. A thermal oxidation treatment at 950° to 1,000° C. follows the step of forming the polysilicon pattern 51a, 51b, so as to form silicon oxide films 52a, 52b having a thickness of about 1,000 to 3,000 Å, high in density, and exhibiting an excellent insulating property (see FIG. 7F). It is seen that the polysilicon pattern 51a, 51b is covered with the silicon oxide films 52a, 52b, and the clearance mentioned above is completely filled with the silicon oxide film. In this thermal oxidation step, the silicon nitride film 49 serves to prevent the oxidizing agent from entering the silicon layer beneath the silicon nitride film 49. Also, the arsenic contained in the polysilicon pattern 51a, 51b is diffused into the p-type base region 47 in the thermal oxidation step so as to form shallow n+-type collector regions 53a, 53b beneath the polysilicon pattern 51a, 51b.

Figure 7F:
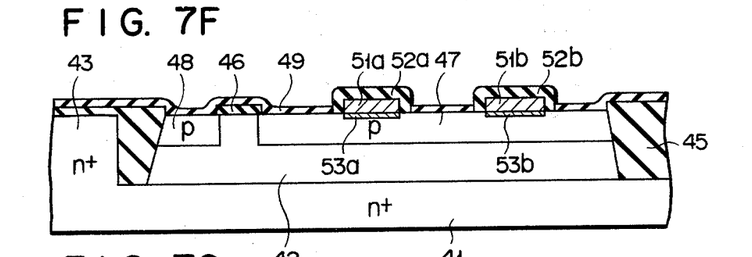
Figure 7G:
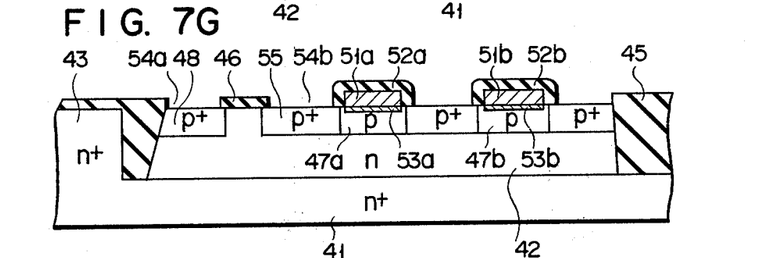

Then, the silicon nitride film 49 is etched with a hot phosphoric acid or dry etchant such as Freon type etchant. Since silicon nitride exhibits a high selective etching property relative to silicon oxide, the silicon nitride film 49 is selectively removed without reducing the thickness of the silicon oxide films 52a, 52b so as to provide openings 54a, 54b as shown in FIG. 7G. Further, a high concentration of boron is injected through the openings 54a, 54b by ion implantation technique, followed by applying a heat treatment to the substrate. As a result, the p-type injector region 48 is converted into p+-type. Also, a p+-type outer base region 55 is formed in the p-type base region 47 exposed by the opening 54b (FIG. 7G). In other words, the p-type base region 47 is separated by the p+-type outer base region 55 into two p-type base regions 47a and 47b.

Figure 7H:
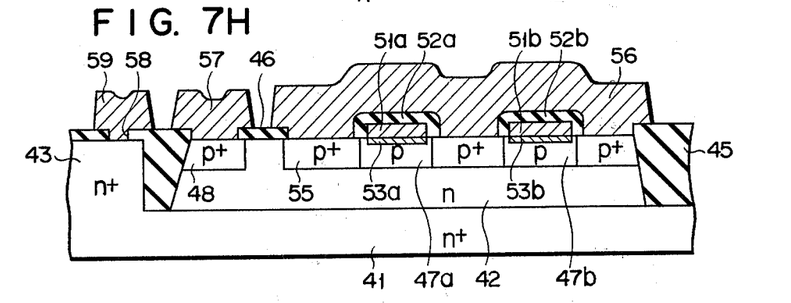

Finally, electrodes are mounted to the device as shown in FIG. 7H so as to produce an I²L. Specifically, an Al film 1 μm thick is deposited first on the entire surface, followed by selectively removing the Al film so as to form desired Al electrodes including a base electrode 56 in contact with the p+-type outer base region 55, an injector electrode 57 in contact with the injector region 48, and an emitter electrode 59 connected to the n+-type diffusion region 43 through a contact hole 58 made in the silicon oxide film 46. It should be noted that the polysilicon pattern 51a, 51b acts as a collector electrode and is insulated from the base electrode 56 by the silicon oxide films 52a, 52b surrounding the polysilicon pattern.

The example shown in FIGS. 7A to 7H permits diminishing the p-type base regions 47a, 47b, rendering it possible to produce an I²L with a high current amplification factor. Also, the silicon oxide films 52a, 52b surrounding the polysilicon pattern 51, 51b do not take an overhanging structure, with the result that the base electrode 56 is prevented from disconnection. Thus, the produced I²L is high in reliability. Further, the n+-type collector regions 53a, 53b can be formed in the base region 47 exposed by the openings 50a, 50b of the silicon nitride film 49, and the locations of the injector and base contact holes, i.e., openings 54a, 54b, can be automatically determined by simply removing the remaining silicon nitride film 49 used as a mask in the step of forming the arsenic-doped polysilicon pattern 51a, 51b. Thus, it is possible to increase the integration density of I²L.

It should also be noted that the p-type base region 47 and the injector region 48 are covered with the silicon nitride film 49 in the step of thermal oxidation. Thus, it is possible to prevent the growth of a thermal oxide film into the p-type base regions 47a, 47b and the injector region 48. Naturally, the polysilicon pattern 51a, 51b can be subjected to a thermal oxidation under the optimum conditions, leading to the formation of the silicon oxide films 52a, 52b which are sufficiently thick and dense. In addition, the thickness of the silicon oxide films 52a, 52b is not reduced in the subsequent step of selectively removing the silicon nitride film 49 because silicon nitride exhibits a high selective etching property relative to silicon oxide. It follows that the n+-type collector regions, 53a, 53b located beneath the polysilicon pattern 51a, 51b are not exposed to the openings 54a, 54b. Naturally, the short circuit between the base and collector regions can be prevented after formation of the base electrode 56. Also, the threshold voltage between the base and collector regions can be increased sufficiently.

Figure 8A:
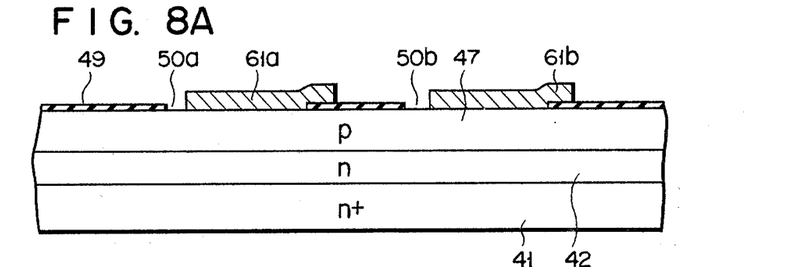
FIGS. 8A to 8C are cross sectional views showing how to form a polysilicon pattern by the method according to another embodiment of the present invention.
Figure 8B:
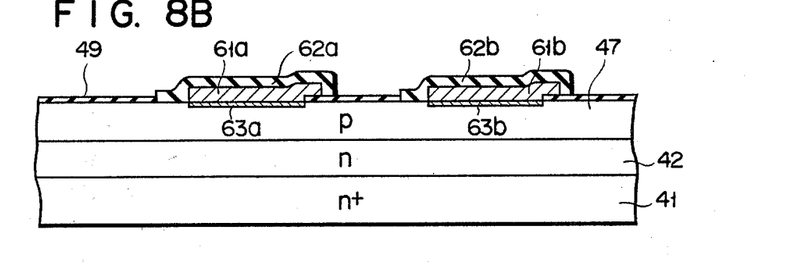
Figure 8C:
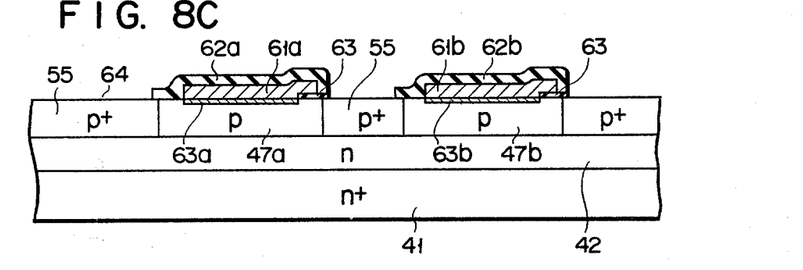

It is important to note that the short circuit between the base and collector regions can be prevented even if deviation occurs between the polysilicon pattern and the openings 50a, 50b in the step of photoetching the arsenic-doped polysilicon layer. FIGS. 8A to 8C are intended to explain the situation.

FIG. 8A shows that the right end portion of the arsenic-doped polysilicon pattern 61a, 61b overlaps with the left end portion of the silicon nitride film 49 because of the masking error in the step of selectively photo-etching the polysilicon layer formed in advance on the entire surface. Naturally, a clearance of a few μm is provided the left end of the polysilicon pattern and the right end of the silicon nitride film 49. In other words, the polysilicon pattern 61a, 61b is not located within the openings 50a, 50b made in the silicon nitride film 49. Under this condition, a thermal oxidation treatment is performed at 1,000° C. As a result, dense silicon oxide films 62a, 62b are formed in a manner to surround the polysilicon pattern 61a, 64b and to cover the exposed p-type base region 47 as shown in FIG. 8B. At the same time, the arsenic contained in the polysilicon pattern is diffused into the p-type base region 47 so as to form n+-type collector regions 63a, 63b. Then, boron is introduced into the p-type base region 47 by ion implantation technique, with the silicon oxide films 62a, 62b used as a mask, followed by an annealing treatment so as to form a p+-type outer base region 55. Further, the silicon nitride film 49 is removed by etching with a hot phosphoric acid or dry etchant such as Freon type etchant as shown in FIG. 8C. It should be noted that the silicon nitride film 49 is left unremoved at an overlapping portion 63 with the polysilicon pattern 61a, 61b and with the silicon oxide films, 62a, 62b surrounding the polysilicon pattern. Thus, the collector regions 63a, 63b and the polysilicon pattern 61a, 61b are not exposed to an opening 64 for the base electrode, which is made by removing the silicon nitride film 49. To be brief, the method of the present invention permits preventing the short circuit between the base and collector regions without providing allowance in masking in the step of forming the polysilicon pattern.

Figure 9:
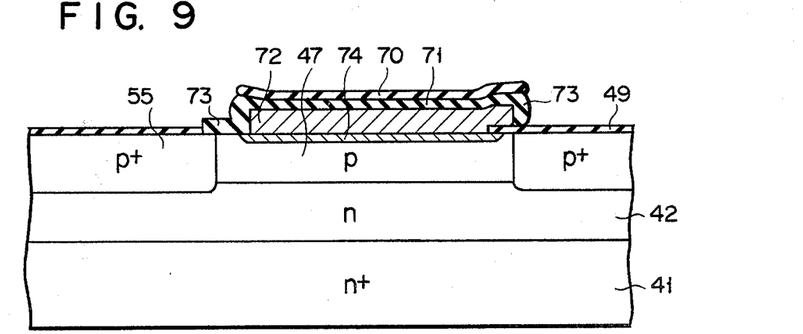
FIG. 9 is a cross sectional view showing the step of forming a polysilicon pattern by the method according to another embodiment of the present invention.

FIG. 9 shows a modification of the above-mentioned embodiment. In the embodiment of FIG. 9, a silicon oxide film and a silicon nitride film are formed in succession by CVD on the arsenic-doped polysilicon layer. Then, the uppermost silicon nitride layer is selectively removed so as to form a silicon nitride pattern 70, followed by selectively etching the silicon oxide layer with the silicon nitride pattern 70 used as the mask so as to form a silicon oxide pattern 71. Further, the polysilicon layer is selectively removed with the laminated patterns 70 and 71 used as the mask so as to form a polysilicon pattern 72. This method is effective in that the upper surface region of the polysilicon pattern 72 is not oxidized in the subsequent thermal oxidation step because of the presence of the silicon nitride pattern 70. In other words, the thickness of the polysilicon pattern 72 acting as the collector electrode is not reduced in the thermal oxidation step, and a sufficiently thick and dense silicon oxide film 73 is formed on the side surface of the polysilicon pattern 72. It follows that the resistance of the collector electrode, i.e., polysilicon pattern, is made lower than in FIG. 8C, leading to a higher operation speed. In addition, the collector region 74 and the polysilicon pattern 72 are not exposed to the opening for the base electrode made by removing the silicon nitride film 49, rendering it possible to enhance further the reliability of the produced I²L.

Incidentally, it is possible to reverse the p-n relationship of the semiconductor regions in the embodiments described above. Also, a silicon nitride film is formed in direct contact with a single-crystalline silicon layer in the embodiments described above. But, it is preferred to form a thin silicon oxide film on the single-crystalline silicon layer, followed by forming a silicon nitride film on the silicon oxide film. In this case, it is possible to prevent the single-crystalline silicon layer from bearing defects.

EXAMPLE 2

FIGS. 10A to 10E collectively show how to produce a static induction transistor logic (SITL) by the method of the present invention.

Figure 10A:
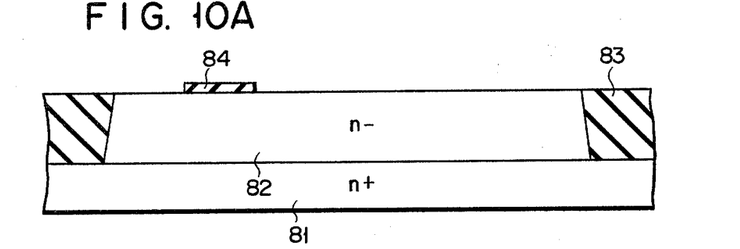
FIGS. 10A to 10E are cross sectional views showing how to produce an SITL by the method according to another embodiment of the present invention.
Figure 10B:
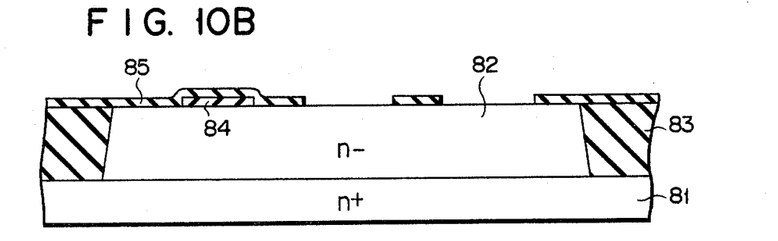

FIG. 10A shows that an n⁻-epitaxial silicon layer 82 having an impurity concentration of $10^{13}$ to $10^{14}$ cm$^{-3}$ is formed on an n+-buried silicon layer 81, followed by forming a silicon oxide film 83 acting as an isolating layer. Then, a silicon oxide pattern 84 having a thickness of, for example, 3,000 Å is formed on the n⁻-epitaxial silicon layer 82. Further, thermal oxidation is applied to the surface of the n⁻-epitaxial layer 82 so as to form a silicon oxide film (not shown) about 100 Å thick, which acts as a pad oxide film. Still further, a silicon nitride film 85 about 500 to 1,000 Å thick is formed on the pad oxide film, followed by selectively removing the laminate of the oxide film and the nitride film as shown in FIG. 10B.

Figure 10C:
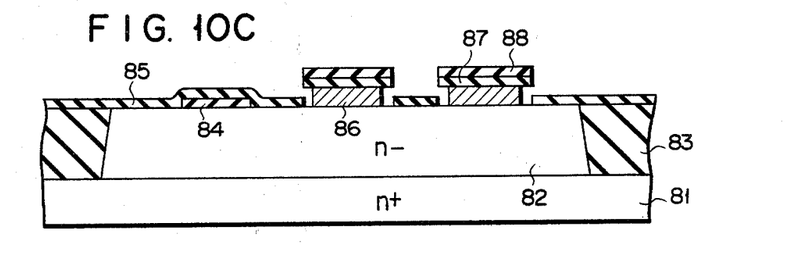
Figure 10D:
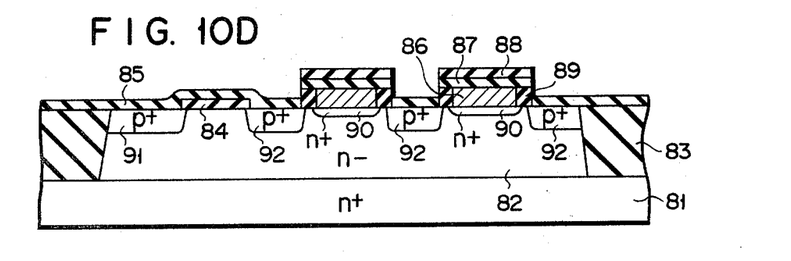

In the next step, an n+-impurity-doped polysilicon film 86 about 2,000 Å thick, a CVD-SiO₂ film 87 about 1,500 Å thick and a silicon nitride film 88 about 1,000 Å thick are deposited in succession on the entire surface, followed by patterning the deposited laminate by photoetching technique. As a result, a laminated pattern consisting of the polysilicon film 86, the CVD-SiO₂ film 87 and the silicon nitride film 88 is formed on, at least, the exposed surface of the n⁻-epitaxial layer 82 as shown in FIG. 10C. In the photoetching step, the silicon nitride film 88 and the CVD-SiO₂ film 87 are anisotropically etched with a Freon type gas etchant by using photo-resist as an etching mask. The etching in this step permits accurately patterning the films 88 and 87. In this case, the photo-resist mask is equal in size to the opening made in the silicon nitride film 85. Then, the polysilicon film 86 is patterned with the remaining laminate of the films 87, 88 used as the mask. Under this condition, a wet oxidation treatment is performed at 900° C. As a result, a silicon oxide film 89 about 3,000 Å thick is formed along the side wall of the polysilicon pattern 86. At the same time, the n-type impurity contained in the polysilicon pattern 86 is diffused into the epitaxial layer 82 so as to form an n+-diffusion region 90. Further, a high concentration of a p-type impurity is introduced into the epitaxial layer 82 by ion implantation technique with the laminate of the patterns 86, 87, 88 used as the mask so as to form a p+-injector 91 and p+-input region 92 as shown in FIG. 10D.

Figure 10E:
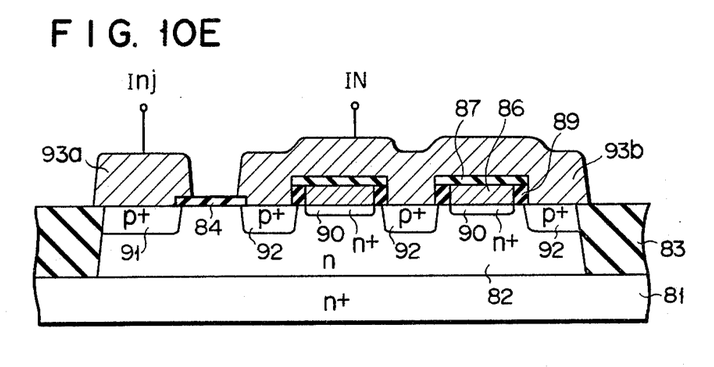

Finally, the remaining silicon nitride films 85 and 88 are removed and, then, interconnection electrodes 93a, 93b are formed as shown in FIG. 10E so as to produce a desired SITL.

Figure 11A:
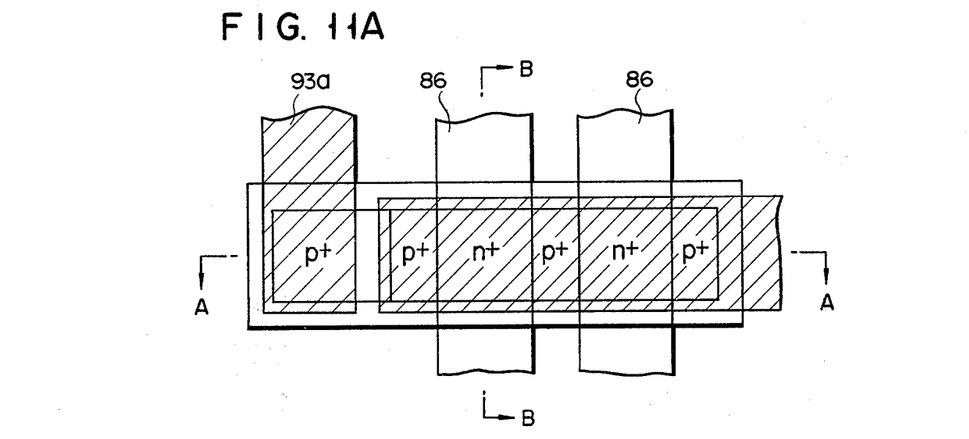
FIG. 11A is a plan view of FIG. 10E.
Figure 11B:
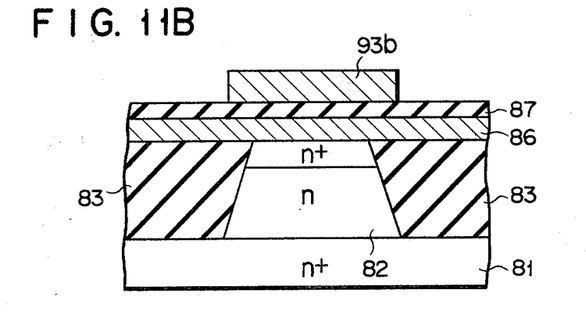
FIG. 11B is a cross sectional view along the line B—B of FIG. 11A.

FIG. 11A is a plan view of the produced SITL. In other words, FIG. 10E corresponds to the cross sectional view along the line A—A of FIG. 11A. On the other hand, FIG. 11B is a cross sectional view along the line B—B of FIG. 11A.

The SITL producing method described above also produces the merits described previously in conjunction with Example 1.

EXAMPLE 3

FIGS. 12A to 12D collectively show how to produce a MOS transistor by the method of the present invention.

Figure 12A:
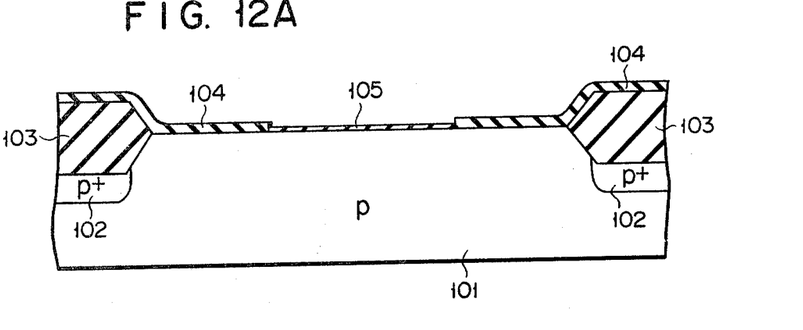
FIGS. 12A to 12D are cross sectional views showing how to produce a MOS transistor by the method according to still another embodiment of the present invention.

FIG. 12A shows that a p+-diffusion region 102 for preventing field inversion and an oxide isolation layer 103 are formed in advance on the surface region of a p-type semiconductor substrate 101. Then, a silicon oxide film (pad oxide film) about 100 Å thick (not shown) is formed on the entire surface, followed by depositing a silicon nitride film 104 about 500 to 1,000 Å thick on the pad oxide film. The silicon nitride film 104 thus formed is selectively removed by photolithography and, then, the exposed pad oxide film (not shown) is also removed so as to expose selectively the substrate 101. Further, a silicon oxide film 105 (gate oxide film) about 400 to 1,000 Å thick is formed on the exposed surface of the substrate 101 (FIG. 12A).

Figure 12B:
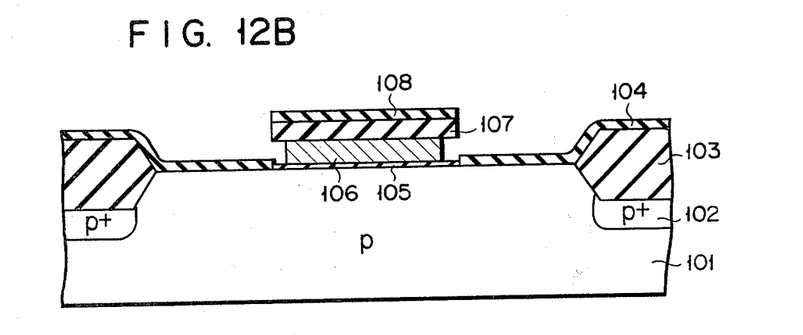
Figure 12C:
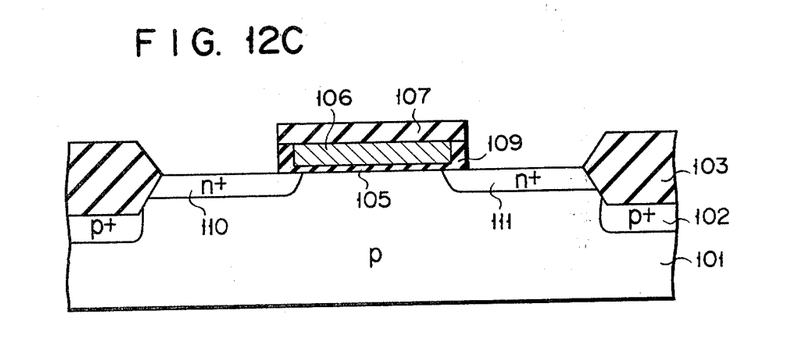
Figure 12D:
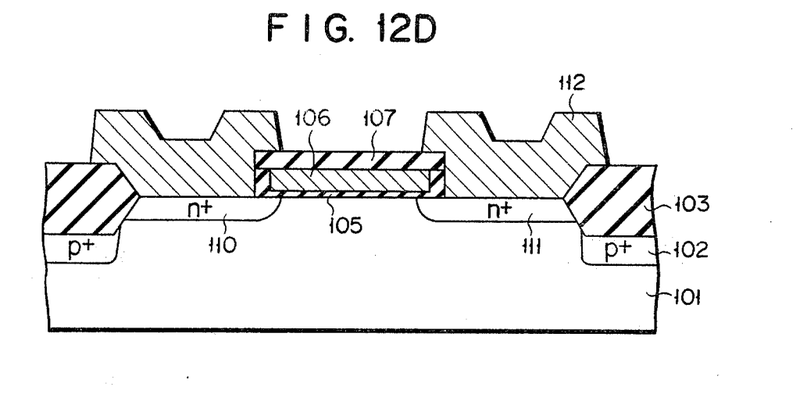
Figure 12E:
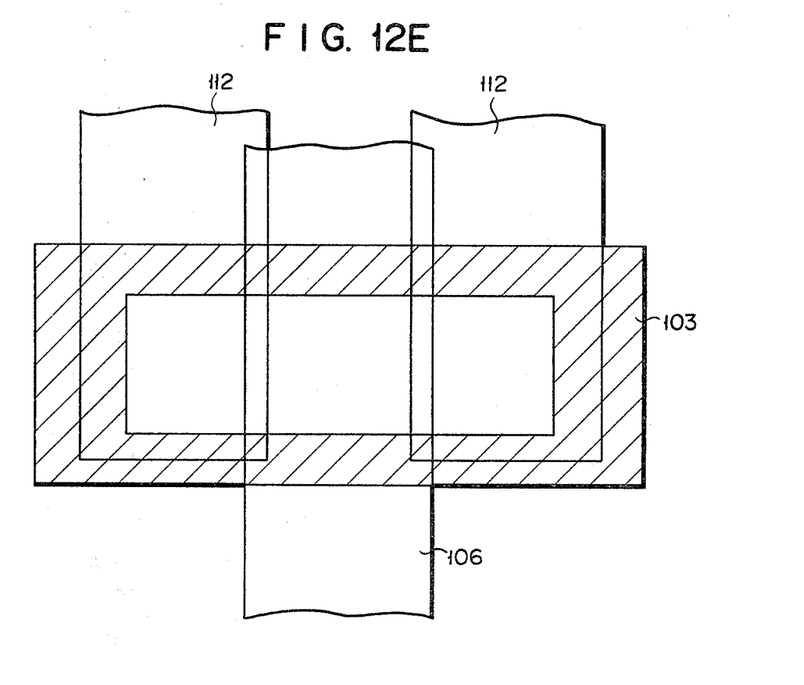
FIG. 12E is a plan view of FIG. 12D.

In the next step, a laminated pattern consisting of an n+-impurity-doped polysilicon film 106 about 4,000 Å thick, a CVD-SiO$_2$ film 107 about 8,000 Å thick and a silicon nitride film 108 about 1,000 Å thick is formed on, at least, the gate oxide film 105 as shown in FIG. 12B. Incidentally, a slight deviation is acceptable in the step of forming the laminated pattern. Then, a silicon oxide film 109 about 1,000 to 2,000 Å thick is formed along the side wall of the polysilicon film 106 by means of thermal oxidation. Further, the silicon nitride films 104 and 108 are removed, followed by introducing an n-type impurity into the substrate 101, with the laminated pattern of the films 106 and 107 used as the mask, so as to form a source region 110 and a drain region 111 as shown in FIG. 12C. Finally, a metal electrode 112 is formed as shown in FIG. 12D so as to produce a desired MOS transistor. Incidentally, FIG. 12E is a plan view of FIG. 12D.

It is important to note that a dense insulating film, i.e., silicon oxide film 109, is formed along the side wall the impurity-doped polysilicon film 106 constituting the gate electrode of the MOS transistor. It follows that a short circuit between the source and drain regions can be prevented without fail. Also, a high threshold voltage is provided between the source region and the gate. Further, the transistor can be operated at a high speed because the diffusion capacitance is decreased.

What is claimed is:

1. A method of producing a semiconductor device, comprising the steps of:
   forming an oxidation-resistive insulating film having one or more openings on a semiconductor substrate of a first conductivity type;
   forming an impurity-doped polysilicon pattern in at least the opening of the insulating film by etching using a mask substantially equal in size to the opening;
   forming a silicon oxide film on the exposed surface of the polysilicon pattern by thermal oxidation;
   removing the oxidation insulating film; and
   depositing a conductive material and, then, patterning said conductive material layer for forming an interconnection electrode layer insulated from the polysilicon pattern by the silicon oxide film.

2. The method according to claim 1, wherein the oxidation-resistive insulating film is formed of silicon nitride or alumina.

3. The method according to claim 1, wherein the step of forming the impurity-doped polysilicon pattern comprises depositing undoped polysilicon on the entire surface, doping the deposited polysilicon layer with an impurity, and patterning the doped polysilicon layer by photolithography using a mask substantially equal in size to the opening of the oxidation-resistive insulating film.

4. The method according to claim 1, wherein the step of forming the impurity-doped polysilicon pattern comprises depositing an impurity-doped polysilicon on the entire surface, and patterning the doped polysilicon layer by photolithography using a mask substantially equal in size to the opening of the oxidation-resistive insulating film.

5. The method according to claim 1, wherein the polysilicon pattern before the thermal oxidation step is covered with a silicon oxide film and said silicon oxide film is covered with a silicon nitride film.

6. The method according to claim 1, wherein the polysilicon pattern is doped with an impurity of the first conductivity type, at least the major portion of the polysilicon pattern is in direct contact with the semiconductor substrate, and the impurity contained in the polysilicon pattern is thermally diffused into the substrate surface region so as to form a semiconductor region of the first conductivity type.

7. The method according to claim 6, wherein the impurity diffusion is performed in the thermal oxidation step.

8. The method according to any one of claims 1 to 7, wherein an impurity of a second conductivity type is introduced into the semiconductor substrate so as to form at least one semiconductor region of the second conductivity type before the step of forming the oxidation-resistive insulating film.

9. The method according to any one of claims 1 to 7, wherein the thermal oxidation step is followed by an additional step of introducing an impurity of the second conductivity type into the substrate surface region by using the silicon oxide film as the mask so as to form a plurality of semiconductor regions of the second conductivity type.

10. The method according to claim 9, wherein the additional step of introducing the second conductivity type impurity precedes the step of removing the oxidation-resistive insulating film.

11. The method according to claim 9, wherein the additional step of introducing the second conductivity type impurity follows the step of removing the oxidation-resistive insulating film.

12. The method according to claim 8, which further comprises the step of introducing the second conductivity type impurity into the substrate surface region, after the thermal oxidation step, with the silicon oxide film used as the mask so as to form a plurality of semiconductor regions of the second conductivity type.

13. The method according to any one of claims 1 to 5, which further comprises the steps of forming an oxide film on the surface of the semiconductor substrate in the opening of the insulating film before forming the impurity-doped polysilicon pattern, introducing an impurity of the second conductivity type into the substrate surface region, after the thermal oxidation step, with the impurity doped polysilicon pattern used as the mask, so as to form a plurality of semiconductor regions of the second conductivity type, and forming an opening in the oxide film on the polysilicon pattern before depositing the conductive material.

* * * * *